US008332735B1

(12) United States Patent
Andrews et al.

(10) Patent No.: US 8,332,735 B1
(45) Date of Patent: Dec. 11, 2012

(54) GENERATING A LOG-LIKELIHOOD RATIO FOR SIGNAL PROCESSING

(75) Inventors: David Andrews, Falkirk (GB); David I. Lawrie, Lauder (GB); Colin Stirling, South Queensferry (GB)

(73) Assignee: Xilinx, Inc., San Jose, CA (US)

( * ) Notice: Subject to any disclaimer, the term of this patent is extended or adjusted under 35 U.S.C. 154(b) by 947 days.

(21) Appl. No.: 12/400,694

(22) Filed: Mar. 9, 2009

(51) Int. Cl.
*H03M 13/00* (2006.01)
(52) U.S. Cl. .......................... 714/795; 714/786
(58) Field of Classification Search .............. 714/786, 714/792, 795
See application file for complete search history.

(56) References Cited

U.S. PATENT DOCUMENTS

| | | | | |
|---|---|---|---|---|
| 6,070,263 | A * | 5/2000 | Tsui et al. | 714/795 |
| 6,563,877 | B1 * | 5/2003 | Abbaszadeh | 375/242 |
| 6,760,879 | B2 * | 7/2004 | Giese et al. | 714/755 |
| 7,810,010 | B1 * | 10/2010 | Lawrie | 714/755 |
| 7,860,181 | B2 * | 12/2010 | Yamagishi et al. | 375/265 |
| 2003/0002603 | A1 * | 1/2003 | Worm et al. | 375/341 |
| 2003/0120996 | A1 * | 6/2003 | D'Arcy et al. | 714/795 |
| 2004/0205445 | A1 * | 10/2004 | Xu | 714/792 |
| 2005/0149838 | A1 * | 7/2005 | Chiueh et al. | 714/795 |

OTHER PUBLICATIONS

Boutillon et al., "VLSI Architectures for the Map Algorithm"; IEEE Transactions on Communicaitons, vol. 51, No. 2; Feb. 2003; pp. 175-185.*
Xilinx, 3GPP LTE Turbo Decoder v1.0, Product Specification, Datasheet, DS675, Apr. 25, 2008, pp. 1-31, Xilinx, Inc. San Jose, CA 95124.
Xilinx, 3GPP LTE Turbo Decoder v1.0, Product Brief, XMP020, Apr. 25, 2008, pp. 1-2, Xilinx, Inc. San Jose, CA 95124.

* cited by examiner

*Primary Examiner* — Joshua Lohn
(74) *Attorney, Agent, or Firm* — W. Eric Webostad; Gerald Chan

(57) ABSTRACT

A method for decoding an encoded message is described. The method includes obtaining a set of metrics which includes first and second state metrics, and first and second branch metrics. First and second offset values for the iteration are obtained. The first state and branch metrics are added together to obtain a first partial result. The second state and branch metrics are added together to obtain a second partial result. The second partial result is subtracted from the first partial result to obtain a difference. The first partial result and the first offset value are added together to obtain a first result. The second partial result and the second offset value are added together to obtain a second result. Either the first result or the second result is selected for output responsive to the difference. A log correction term is selected responsive to the difference.

20 Claims, 10 Drawing Sheets

```
void star_acos(
        StateMetric s0, OffsetMetric o0, BranchMetric g0,  ←── 801
        StateMetric s1, OffsetMetric o1, BranchMetric g1,  ←── 802
        StateMetrix& res_s, OffsetMetric& res_o  ←── 803
)
{
        //Add stage
        StateMetric  add_s0=s0+g0;
        OffsetMetric add_o0=o0;              ⎫
        StateMetric  add_s1=s1+g1;           ⎬ 804
        OffsetMetric add_o1=o1;              ⎭

//Compare and offset stage
        StateMetric co_s0=add_s0+add_o0;
        StateMetric co_diff=add_s0-add_s1;  //Comparison occurs before    ⎫ 805
correction offsets are applied
        StateMetric co_s1=add_s1+add_o1;

//Select stage
        res_s=(co_diff>=0 ? co_s0 : co_s1);  //Select corrected metric based
on uncorrected difference                                                  ⎫ 806
        res_o=offset_lookup(co_diff);       //Get correction term for next
iteration
}
```

FIG. 8

GENERATING A LOG-LIKELIHOOD RATIO FOR SIGNAL PROCESSING

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. The following notice applies to the pseudocode provided in FIG. 8: © 2008 Xilinx Incorporated.

FIELD OF THE INVENTION

The invention relates to integrated circuit devices ("ICs"). More particularly, the invention relates to generating a log-likelihood ratio for signal processing by an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

A convolutional code decoder, such as a Turbo Code decoder, may employ a maximum a posteriori ("MAP") algorithm. Additionally, Viterbi decoders may use a MAP algorithm. In a MAP algorithm, a calculation of the form shown in Equation (1) is repeatedly performed. The form of the calculation is:

$$s_x(n+1) = s_a(n) \cdot g_a(n) + s_b(n) \cdot g_b(n), \quad (1)$$

where $s_x$, $s_a$, and $s_b$ represent state metrics, and where $g_a$ and $g_b$ represent branch metrics. Equation (1) is in the linear domain; however, signals may be rectified in the log domain as described below in additional detail.

In the linear domain, there are two multiplications and an addition. Two previous state metrics $s_a$, and $s_b$ are respectively multiplied by two branch metrics $g_a$ and $g_b$, and the results of such multiplications are added to obtain a new state output $s_x(n+1)$.

Generally, MAP-based turbo decoders use an addition-compare-select-offset unit ("ACSO") or an addition-compare-select unit ("ACS") in alpha, beta, and LLR calculations. The number of such units depends on the constant length of the convolutional code and how parallel the turbo decoder is. For example, in a Third Generation Partnership Project Long-Term Evolution ("3GPP LTE") convolutional code decoder, there are eight states, namely a three "soft bit" convolution code used to represent eight states. For purposes of clarity by way of example and not limitation, only a single ACSO is illustratively shown in several of the figures, as implementation of multiple ACSOs shall be understood by one of skill in the art from the description.

The probability for each of the states, such as for example eight states, is determined to evaluate bit state probability, e.g., probability of a soft bit signal at an instant in time ("bit state") representing a binary one or zero at that state. So generally a previous state probability, e.g., state metric, is multiplied by a probability of going from one state to another, e.g., a branch metric, to obtain a partial probability of being at a next state, namely the state immediately following the previous state probability, for a bit state, and the partial probabilities are added to obtain a probability of being at the next state for such bit state.

Conventionally, the MAP algorithm is transformed into the log domain to remove the multiplications, yielding the log-MAP algorithm as represented in Equation (2):

$$S_x(n+1) = f(S_a(n) + G_a(n), S_b(n) + G_b(n)), \quad (2)$$

where $S_x$, $S_a$, and $S_b$ represent log domain state metrics, and where $G_a$ and $G_b$ represent log domain branch metrics. Additionally, f( ) represents a function to implement addition in the log domain, and this addition is of the form:

$$f(d_1, d_2) = \max(d_1, d_2) + \log(1 + e^{-|d_2 - d_1|}). \quad (3)$$

Thus, the multiplications in the linear domain become additions in the log domain, and the addition of partial probabilities, namely $d_1$ and $d_2$, is of the form in Equation (3), namely a maximum with a log term. The log term in Equation (3) is a correction factor that may be precomputed for various variables and such precomputed correction factors may be selectively obtained from a table of correction factors.

In hardware, Equation (3) may be implemented as an ACSO 200 as illustratively shown in FIG. 2. ACSO 200 includes an add stage 210, a compare stage 220, a select stage 230, and an offset stage 240. The log term in Equation (3) may be implemented with a fixed lookup table ("LUT") 201 having stored therein correction factors as part of select stage 230. The limited precision offered by LUT 201 slightly degrades error-correcting performance, and the resulting approximation is referred to as a max-star log-MAP algorithm result, namely $S_x$ 202, which may be obtained from register 221.

A further approximation to this function is to drop the log correction term altogether, resulting in the max log-MAP algorithm of Equation (4):

$$S_x(n+1)=\max(S_a(n)+G_a(n),S_b(n)+G_b(n)). \quad (4)$$

In hardware, the max log-MAP algorithm may be implemented as an add-compare-select unit ("ACS") 300 as illustratively shown in FIG. 3. ACS 300 is the same as ACSO 200 of FIG. 2, except that offset stage 240 is effectively removed and a register 341 is added to and LUT 201 is dropped from select stage 230 for forming select stage 330. From an output port of register 341, a max log-MAP algorithm result, namely $S_x$ 302, may be obtained. This hardware simplification results in an ACS unit that is smaller and faster than a similar ACSO unit. However, such an ACS does sacrifice some error-correcting performance in comparison to a similar ACSO unit.

As versions of the log-MAP algorithm are iterative, each state metric output is iteratively fed back as an input for a next calculation. Here the use of the terms "iterative" and "iteration" refers to the iterative nature of the calculations. However, it should be understood that state metric outputs are fed back to form a series of calculations. A block of state metric calculations is known as "an iteration." Thus, "an iteration" for turbo decoder calculations means a series or block of state metric calculations. ACS and ACSO latency is an aspect of performance. In some applications, ACS/ACSO latency may be part of a "critical" or "speed-limiting" path of single cycle of a convolution code decoder, such as a Turbo Decoder, and therefore such latency may dictate maximum operating speed of such decoder. Conventionally, an ACSO unit has a higher latency than a similar ACS unit.

To increase operating speed, a pipelined ACS or ACSO unit may be employed. A conventional pipelined ACS 400 is illustratively shown in FIG. 4. ACS 400 includes add stage 410, compare stage 420 and select stage 430. Add stage 410 and compare stage 420 are respectively the same as add stage 210 and compare stage 220 of FIG. 3 for example, except outputs of each of the blocks in stages 410 and 420 are registered with respective registers for pipelining. Furthermore, select stage 430 is the same as select stage 330 of FIG. 3, except for the addition of another register stage, namely register 441.

ACS 400 has a latency of four clock cycles because of the addition of register 441 in select stage 430 coupled to receive output from register 341. Register 441 is added to aid feedback routing and allow injection of initialization values (not shown). ACS 400 having four register stages is capable of processing up to four independent state metric calculations at a time, namely four independent state metric calculations may be occurring within ACS 400 at a time in a pipelined multi-threaded manner. Furthermore, with the addition of a scheduler (not shown), each thread can be operated on separate code blocks where a code block is a convolutional code decoder and such code block may be implemented using a series of ACS 400 or ACS 400 coupled in parallel, or a combination of both.

A conventional pipelined ACSO 500 is illustratively shown in FIG. 5. ACSO 500 includes add stage 410, compare stage 420, select stage 530, and offset stage 540. Add stage 410 and compare stage 420 are respectively the same as those stages in FIG. 4. Select stage 530 is the same as select stage 230 of FIG. 2, except outputs of each of the blocks in stage 530 are registered with respective registers for pipelining. Offset stage 540 is the same as offset stage 240 of FIG. 2, except for the addition of another register stage, namely register 541.

A first stage of registers, namely first register stage 411, is located in add stage 410. A second register stage, namely register stage 412, is located in compare stage 420. A third register stage, namely register stage 413, is located in select stage 530. A fourth register stage, namely register stage 414, is provided by register 221. An additional register stage, namely a fifth register stage 415, is provided by register 541. Registers 221 and 541 are coupled in series and located in offset stage 540.

ACSO 500 has a latency of five clock cycles because of the addition of register 541 in offset stage 540 coupled to receive output from register 221. Register 541 is added to aid feedback routing and allow injection of initialization values (not shown). ACSO 500 having five register stages is capable of processing up to five independent state metric calculations at a time; in other words, five independent state metric calculations may be occurring within ACSO 500 at a time in a pipelined multi-threaded manner. Furthermore, with the addition of a scheduler (not shown), each thread can be operated on separate code blocks where a code block is a convolutional code decoder and such code block may be implemented using a series of ACS 400 or ACS 400 coupled in parallel, or a combination of both.

It should be understood that because of the odd number of clock cycles in ACSO 500, in addition to having a latency of five clock cycles, control and scheduling logic becomes more complex. Complexity of such control and scheduling logic is conventionally simplified when the number of threads that may be processed is a binary number, namely a power of two. For example, 3GPP LTE code blocks all divide evenly into 4 or 8 threads, but do not divide evenly into 5 threads. A pipelined convolutional code decoder, such as a Turbo Code or Turbo Decoder, is often difficult to implement with error correcting performance of a max-star log-MAP algorithm due to latency constraints.

Accordingly, it would be desirable and useful to provide means to provide an ACSO unit with reduced latency.

SUMMARY OF THE INVENTION

An aspect relates generally to a method for decoding an encoded message. A set of metrics associated with the encoded message is obtained that includes a first state metric, a second state metric, a first branch metric, and a second branch metric. A first offset value and a second offset value are obtained. The first state metric and the first branch metric are added together to obtain a first partial result. The second state metric and the second branch metric are added together to obtain a second partial result. The second partial result is subtracted from the first partial result to obtain a difference. The first partial result and the first offset value are added together to obtain a first result. The second partial result and the second offset value are added together to obtain a second result. Either the first result or the second result is selected for output responsive to the difference. A log correction term is selected responsive to the difference. The selected log correction term is output, where the selected log correction term is used to decode the encoded message.

For the above method, one or more of the following may be embodied: a maximum-star ("max-star") log-MAP algorithm for the decoding; selection of the log correction term responsive to a sign of the difference; using the log correction term for obtaining another one of each of the first offset value and the second offset value for another iteration of the decoding; and using the output selected for obtaining another set of metrics for the other iteration.

Another aspect relates generally to a method for generating a log-likelihood ratio for signal processing. A first log representation of a first signal state probability associated with a block of information is obtained. A first log correction term for the first signal state probability is obtained. The first log representation is provided as both a first state value and a second state value to a pipelined add-compare-offset-select ("ACOS") circuit configured to approximate a log-maximum a posteriori ("MAP") algorithm. The first log correction term is provided as both a first offset value and a second offset value to the pipelined ACOS circuit. The first branch value and a second branch value associated with the block of information are obtained. A first branch value and the second branch value are provided to the pipelined ACOS circuit. The pipelined ACOS circuit is configured for: adding the first state value and the first branch value together to obtain a first partial result; adding the second state value and the second branch value together to obtain a second partial result; subtracting the second partial result from the first partial result to obtain a difference; adding the first partial result and the first offset value together to obtain a first result; adding the second partial result and the second offset value together to obtain a second result; and selecting for output either the first result or the second result responsive to the difference.

For the above method, the following may be embodied: pipeline processing of the block of information through the pipelined ACOS with a four clock cycle latency for determining likelihood of bit positions of the block of information. The pipelined processing may include: feeding back the output selected as a second log representation of a second signal state probability associated with the block of information to provide the second log representation as both the first state value and the second state value to the pipelined ACOS circuit; selecting a second log correction term responsive to the difference for the second signal state probability; and feeding back the second log correction term as both the first offset value and the second offset value to the pipelined ACOS circuit. Furthermore, for the above method, one or more of the following may be embodied: storing a set of log correction terms in a look-up table of the pipelined ACOS circuit for obtaining responsive to differences generated by the pipelined processing, using sign of the difference for the selecting of the output from the pipelined ACOS circuit; coupling the pipelined ACOS circuit to a routing network having a trellis structure associated with a convolutional code; coupling the pipelined ACOS circuit to receive the output fed back and the second log correction term fed back; and configuring the routing network to provide the first state value and the second state value responsive to the output fed back and to provide the first offset value and the second offset value responsive to the second log correction term fed back.

Yet another aspect relates generally to a circuit that includes an add stage, a compare and offset stage coupled to the add stage, and a select stage coupled to the compare and offset stage. The select stage is coupled for providing a log-likelihood ratio and a log correction term as feedback inputs. The circuit is an implementation for approximating a log-maximum a posteriori ("MAP") algorithm.

For the above circuit, one or more of the following may be embodied: the circuit is coupled to a routing network; the routing network is coupled to receive the log-likelihood ratio and the log correction term as feedback inputs; the routing network is configured to provide a first state metric and a second state metric responsive to the log-likelihood ratio; the routing network is further configured to provide a first offset value and a second offset value responsive to the log correction term; the add stage is coupled to receive the first state metric, the second state metric, the first offset value, and the second offset value; the add stage is further coupled to receive a first branch metric and a second branch metric. Furthermore, the add stage may be configured to: add the first state metric and the first branch metric together to obtain a first partial result; add the second state metric and the second branch metric together to obtain a second partial result; and register the first partial result, the second partial result, the first offset value, and the second offset value in a first register stage.

Moreover, for the above circuit, one or more of the following may be embodied: the compare and offset stage is configured to: subtract the second partial result from the first partial result to obtain a difference, add the first partial result and the first offset value together to obtain a first result, add the second partial result and the second offset value together to obtain a second result, and register the first result, the second result, and the difference in a second register stage; and the select stage is configured to: select for output either the first result or the second result responsive to the difference, select the log correction term from a table of log correction terms responsive to the difference, register the output selected and the log correction term in a third register stage, and register the output selected and the log correction term in a fourth register stage for providing of the log-likelihood ratio and the log correction term as the feedback inputs.

Furthermore, for the above circuit, one or more of the following may be embodied: the routing network is a trellis structure associated with a convolutional code; the routing network is configured to provide the output selected for feedback as both the first state metric and the second state metric for another iteration of the approximation of the log-MAP algorithm; the routing network is configured to provide the log correction term for feedback as both the first offset value and the second offset value for another iteration of the approximation of the log-MAP algorithm; the select stage includes a multiplexer for selecting between the first result and the second result; a control input to the multiplexer for the selecting is a Most Significant Bit of the difference; the circuit has a four clock cycle latency for a complete iteration of the approximation of the log-MAP algorithm; and the circuit is implemented in a Field Programmable Gate Array as a pipelined circuit configured for multi-threaded operation.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 8 is a pseudocode listing depicting an exemplary embodiment of a listing for an ACOS such as the ACOS of FIG. 6.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
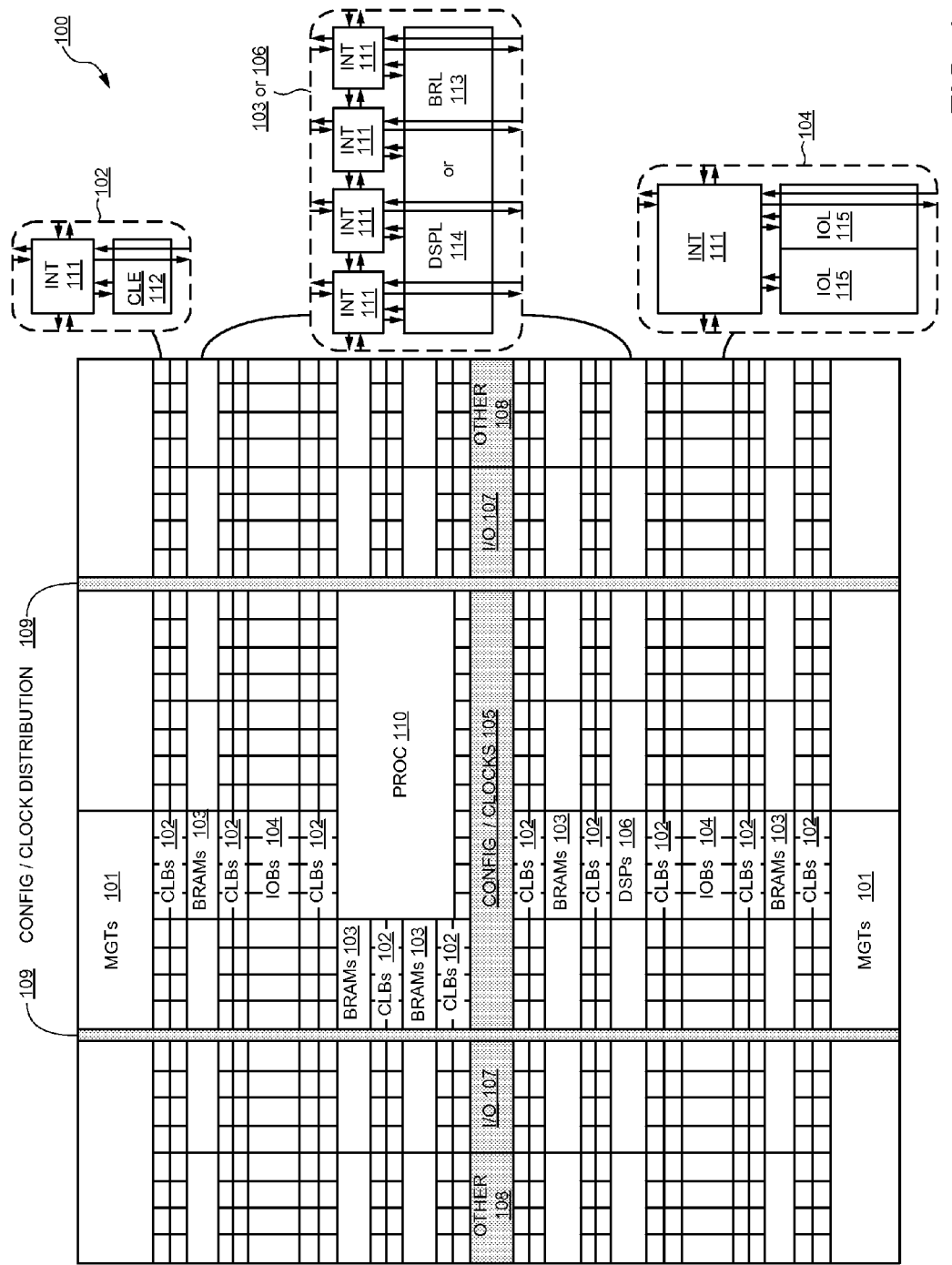
FIG. 1 is a simplified block diagram depicting an exemplary embodiment of a columnar Field Programmable Gate Array ("FPGA") architecture in which one or more aspects of the invention may be implemented.
Figure 2:
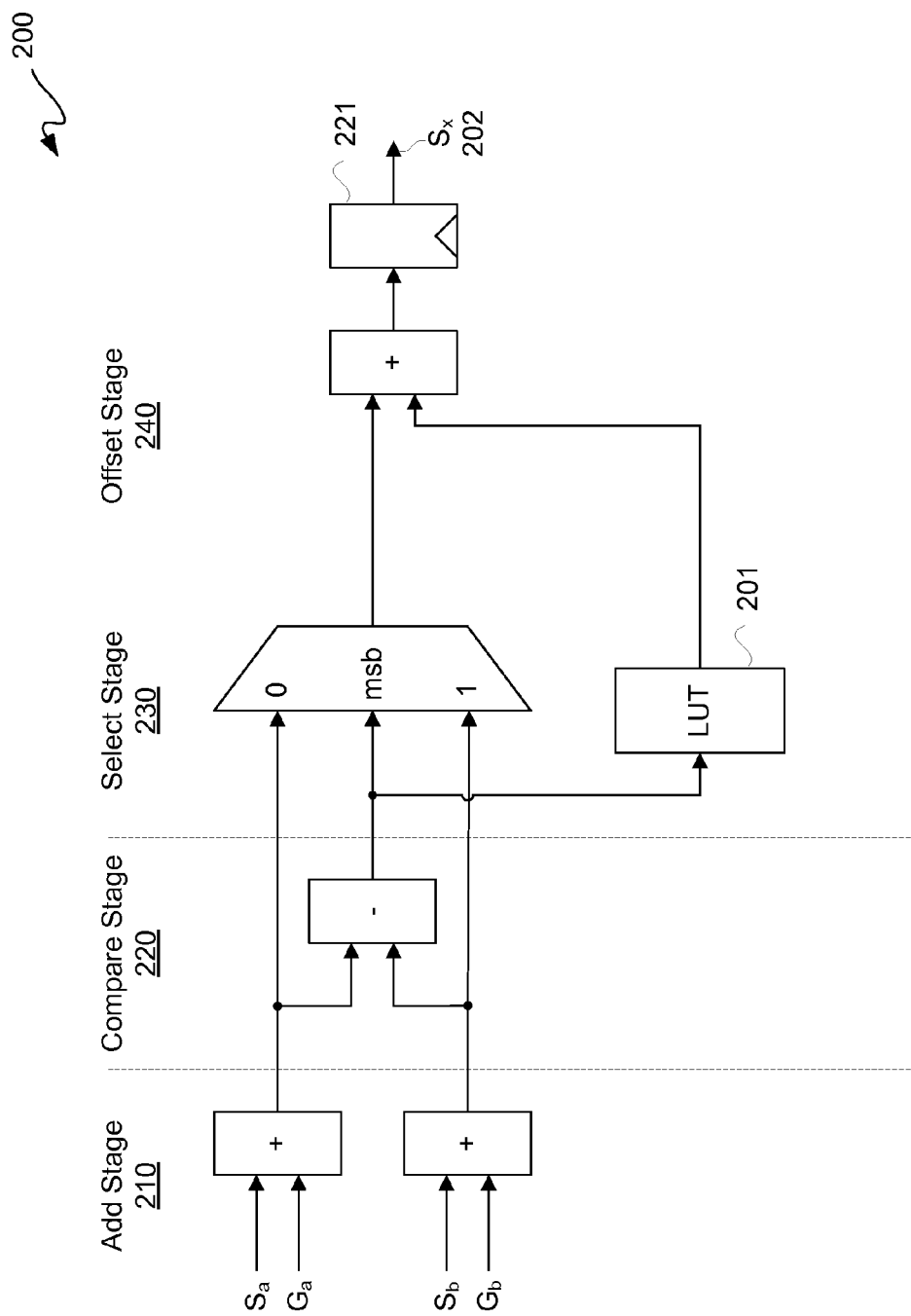
FIG. 2 is a block diagram depicting an addition-compare-select-offset unit ("ACSO") of the prior art.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 6:
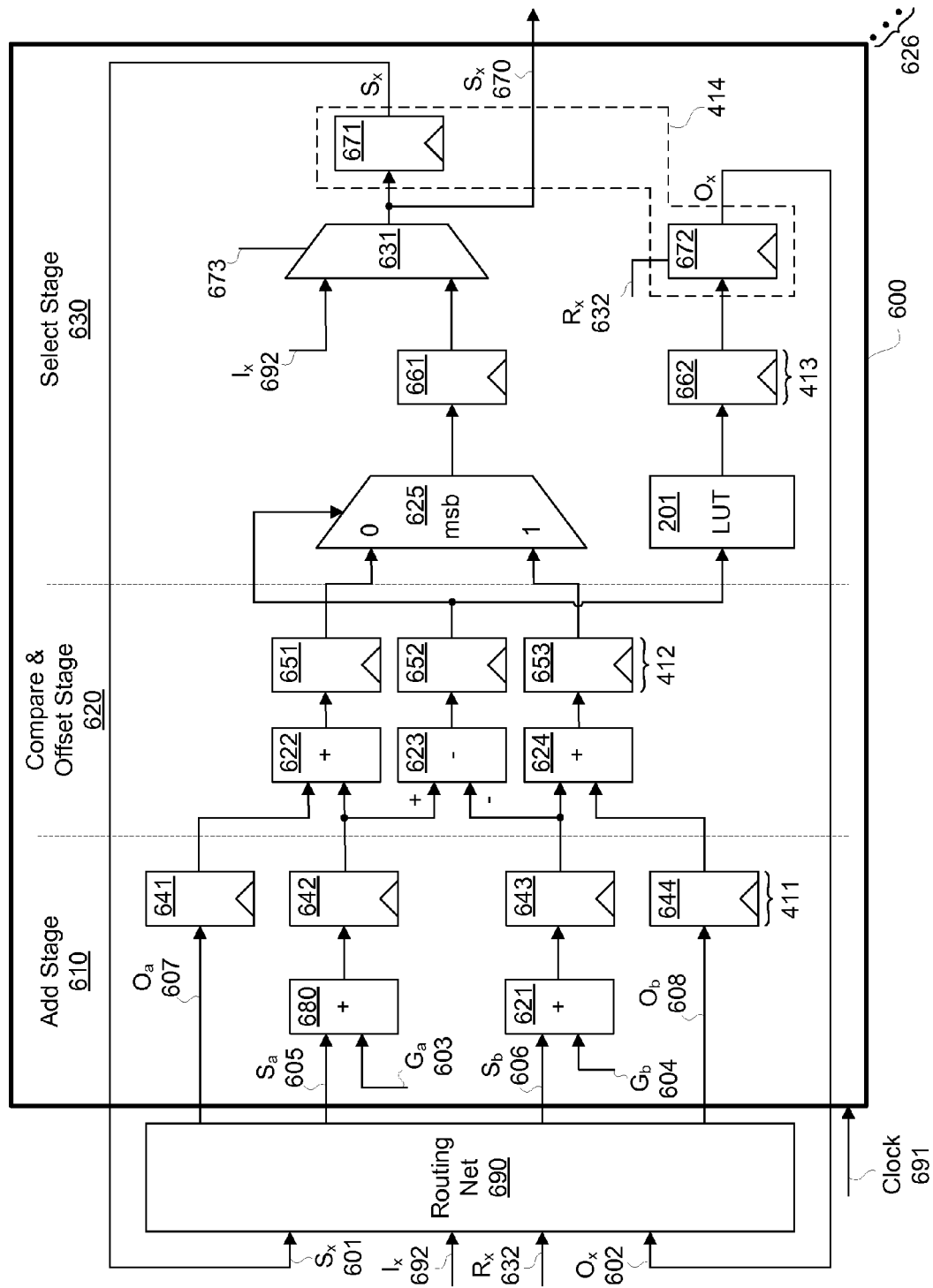
FIG. 6 is a block diagram depicting an exemplary embodiment of a pipelined Add-Compare-Offset-Select unit ("ACOS") coupled to a routing network.

FIG. 6 is a block diagram depicting an exemplary embodiment of a pipelined Add-Compare-Offset-Select unit ("ACOS") 600 coupled to a routing network 690. ACOS 600 includes add stage 610, compare and offset stage 620, and select stage 630.

With reference to add stage 610, it includes add blocks 621 and 680, which for example may be implemented with respect to adders, and registers 641 through 644. Registers 641 through 644 form a first register stage, namely register stage 411. Registers 641 and 644 have respective data input ports coupled to receive offset values. More particularly, register 641 receives offset value $O_a$ 607 from routing network 690, and register 644 receives offset value $O_b$ 608 from routing network 690.

While it should be understood that ACOS 600 may be implemented in applications that include error correction or log likelihood ratio determination, among other applications where conventional ACSOs have previously been employed, it shall be assumed that routing network 690 is part of a decoder for purposes of clarity by way of example and not limitation. Furthermore, it should be appreciated that in an implementation, routing network 690 may be coupled to multiple ACOSs 600, as generally indicated by ellipses 626.

Routing network 690 determines which state metrics, such as state metrics $S_a$ 605 and $S_b$ 606, are provided to which ACOS. For purposes of clarity, it may be assumed that routing network 690 has a trellis structure associated with a convolutional code to be decoded. Furthermore, it may be assumed that state metrics $S_x$ 601 and offset value $O_x$ 602 fed back to routing network 690 may respectively be 12- and 3-bits wide, respectively, though it should be appreciated that other bit widths may be used depending on the application. Thus, it is assumed that effectively a 15-bit number is fed back.

Routing network 690 may be implemented using programmable fabric resources or may have a dedicated or nonprogrammable routing. However, it should be appreciated that routing network 690, once programmed or formed, operates as a fixed routing network for purposes of providing a trellis structure. While the routing network is assumed to be fixed for purposes of clarity by way of example and not limitation, it should be understood that the routing network need not be fixed. For example, the same ACOSs can be used to implement different parts of the algorithm. While two or more ACOSs, each with a fixed function, may be used, alternatively a single ACOS may be used to perform the functions and in this embodiment the routing may be changed dynamically for the different parts of the MAP algorithm.

Routing network 690 provides state metrics 605 and 606, respectively, to adders 680 and 621. Another data input port of adder 680 is coupled to receive branch metrics $G_a$ 603, and another data input port of adder 621 is coupled to receive branch metrics $G_b$ 604. As is known, each soft bit to be decoded may have branch metrics generated for it which are dependent upon multiple factors. These branch metrics 603 and 604 may change on each cycle. As generation of such branch metrics is well-known, it is not described here in unnecessary detail for purposes of clarity.

For an iteration, namely processing through all four register stages, responsive to a clock signal 691, a set of metrics associated with a log-MAP algorithm may be obtained. After an initial cycle of clock signal 691 for an iteration, initial condition $I_x$ 692 and set or reset state $R_x$ 632 may be fed to routing network 690 to generate state metrics 605 and 606 and offset values 607 and 608, respectively. For such iteration, branch metrics may be generated to provide branch metrics 603 and 604, as previously described.

On a subsequent clock cycle, outputs from adders 680 and 621, namely the respective sums of state and branch metrics, are registered in registers 642 and 643, respectively. Thus, state metrics 605 and branch metrics 603 are added together by adder 680 to provide a sum or partial result for registering in register 642, and state metrics 606 and branch metrics 604 are added together by adder 621 to provide a sum or partial result for registering in register 643. Thus, after clock cycle 0 of an iteration, namely on clock cycle 1 of such iteration, such sums may be respectively registered by registers 642 and 643. Likewise, offset values 607 and 608 may be respectively registered in registers 641 and 644 on clock cycle 1.

Compare and offset stage 620 includes adders 622 and 624, subtractor 623, and registers 651 through 653. Registers 651 through 653 form a second register stage, namely register stage 412. During clock cycle 2 of an iteration, output from register 642 is provided as a data input to an add block, such as adder 622, and a subtract block, such as may be implemented with subtractor 623. Furthermore, during clock cycle 2 of an iteration, the partial result registered in register 643 is provided as a data input to an add block, such as adder 624, and a subtract block, such as subtractor 623. In this particular example, output of register 642 is provided to a plus port of subtractor 623 and output of register 643 is provided to a minus port of subtractor 623. Thus, the partial result stored in register 643 is subtracted from the partial result stored in register 642 by subtractor 623 to output a resulting difference. Such difference is provided from subtractor 623 to a data input port of register 652.

Also during clock cycle 2 of an iteration, an offset value stored in register 641 is provided to a data input port of adder 622 for adding with the partial result stored in register 642. The sum or result from such addition by adder 622 is provided to a data input port of register 651. In parallel, the offset value stored in register 644 is provided to the data input port of adder 624 for adding with a partial result stored in register 643, and the sum or result of such addition by adder 624 is provided to a data input port of register 653.

Figure 5:
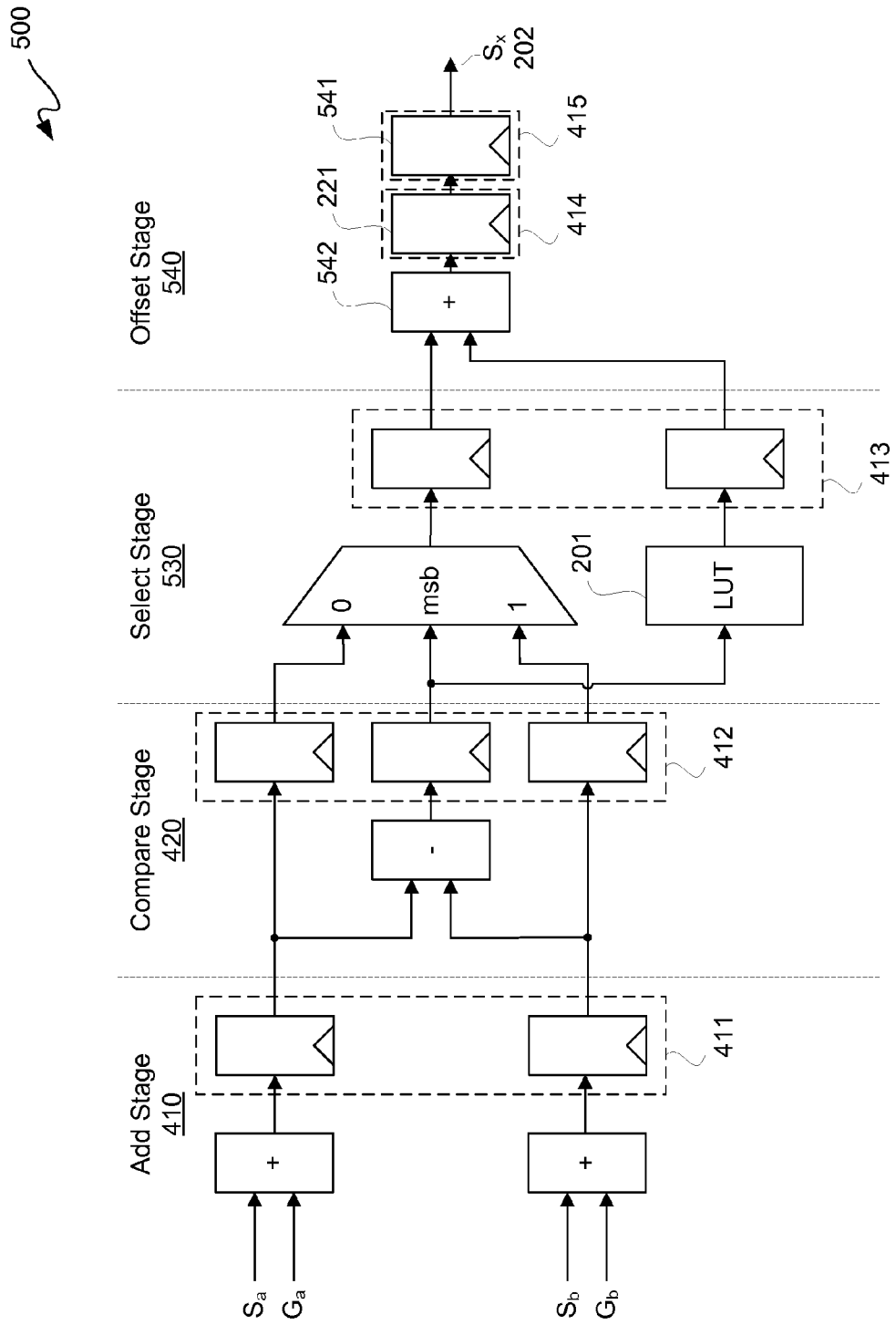
FIG. 5 is a block diagram depicting a pipelined ACSO of the prior art.

It should be appreciated that the add function performed in an offset stage, such as offset stage 540 of FIG. 5, is not the same as the add function performed in compare and offset stage 620. Even though it may be thought that effectively the adder of offset stage 540 is moved forward to be immediately after add stage 610, the addition is not for the same condition of values. In offset stage 540 of FIG. 5, the add is of corrected values because a correction factor is provided from LUT 201 to adder 542 of offset stage 540. The correction terms are not from previous soft bits. The two correction offsets are for the bits being considered in this stage of the pipeline. If stage 620 was reconfigured so subtractor 623 obtained its inputs from the outputs of adders 622 and 624 instead of its inputs, such a reconfigured ACSO would be mathematically equivalent to a standard ACSO and it would be bigger and just as slow. However, because the "next" compare stage is bypassed in ACOS 600, the compare performed by subtractor 623 is of uncorrected values.

Figure 3:
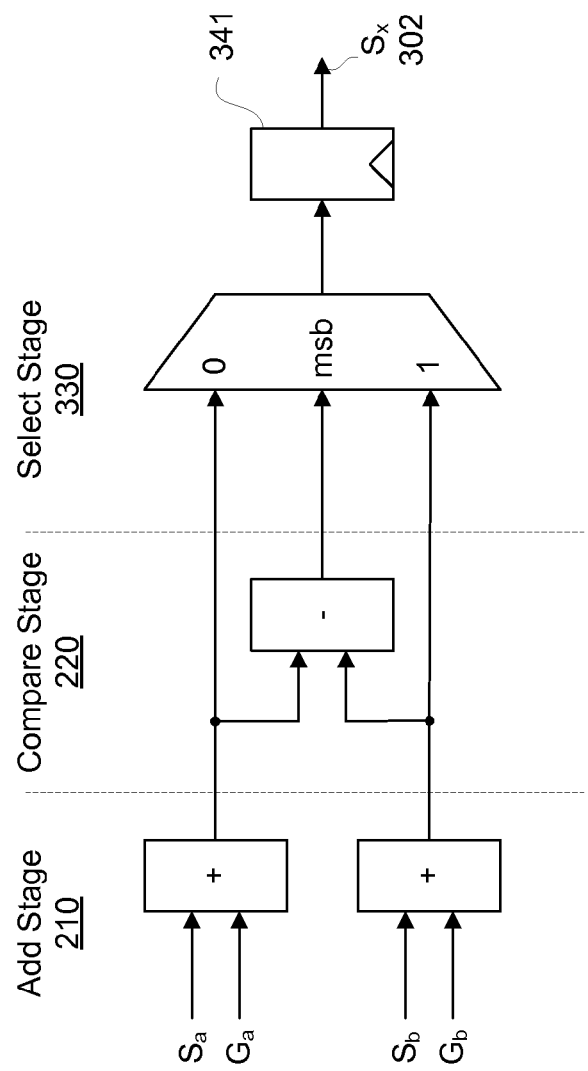
FIG. 3 is a block diagram depicting an add-compare-select unit ("ACS") of the prior art.
Figure 4:
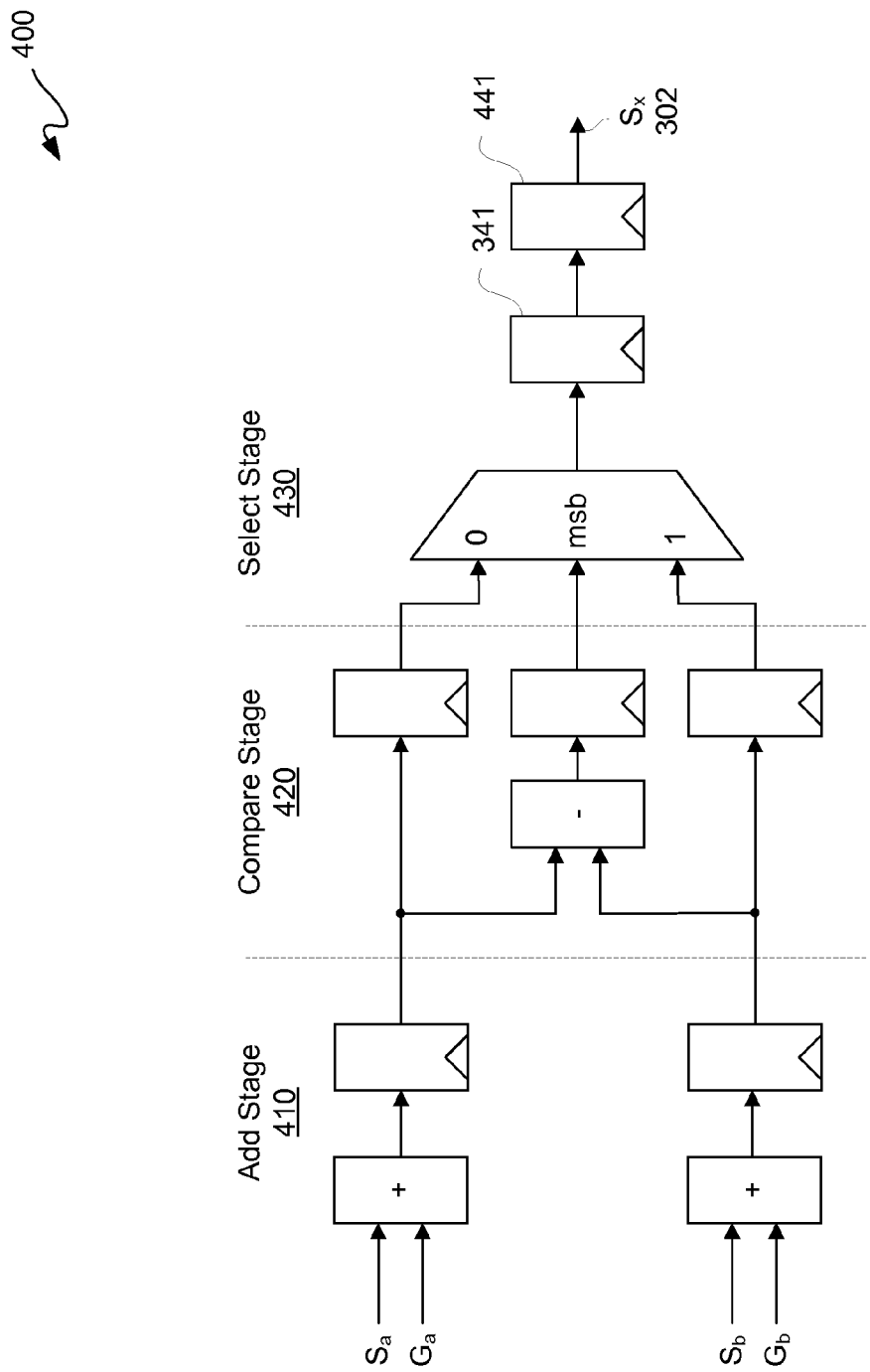
FIG. 4 is a block diagram depicting a pipelined ACS of the prior art.

Because as previously indicated, routing network 690 provides a fixed point trellis structure, relative difference of partial results stored in registers 642 and 643 for sufficiently large numbers, as may be seen in many applications, is minimal. Accordingly, in many instances, the correction factor shall be 0. Thus, by effectively delaying application of correction offsets during compare and offset stage 620, namely a subtraction provided by subtractor 623, such comparison is performed based on uncorrected state metrics 605 and 606. In other words, correction offsets 607 and 608 are "lazily" applied during a compare stage of a next iteration. Thus, even though the compare decision is based on uncorrected state metrics, select stage 630 continues to operate on corrected metrics. Accordingly, in this embodiment, ACOS 600 may be directly substituted as a "drop-in" replacement for an ACS or ACSO unit while having error correcting performance that substantially approximates a max-star log-MAP algorithm with equivalent latency to an ACS but less latency than an ACSO. ACOS 600 has equivalent latency, namely a four clock cycle latency, to an ACS unit, such as ACS 300 of FIG. 3. If the absolute difference resulting from the comparison/subtraction of partial results stored in registers 642 and 643 is comparable to the magnitude of correction offsets, then the compare decision may be different from that of a full ACSO unit, such as ACSO 500 of FIG. 5. In other words, while ACSO 500 of FIG. 5 may be thought of as a max-star log-MAP algorithm implementation, or an approximation to such an algorithm by storing discrete correction factors in LUT 201, ACOS 600 of FIG. 6 is a further approximation to such approximation of a max-star log-MAP algorithm.

In stage 620, there are two sets of state metrics: one set of the state metrics is uncorrected, and another set of the state metrics is corrected. Both sets of state metrics are for the same set of soft bits. Thus, in ACOS 600 a difference generated by subtractor 623 is generated using uncorrected metrics.

Returning to compare and offset stage 620, registers 651 and 653 are used to balance pipeline delay and outputs of registers 651 and 653 are provided to respective logic 0 and 1 ports of multiplexer 625. Output of register 652 is provided to an input of LUT 201 and provided as a control select input to multiplexer 625. More particularly, a Most Significant Bit ("MSB") of the output of register 652, namely a compare result bit indicating sign of such result, may be provided as a control select input to multiplexer 625.

While it has been described that the compare decision is performed with a subtractor 623, it should be appreciated that other comparison circuits for comparing two values may be used for generating a control select signal as described herein. However, because the MSB will indicate the sign of the comparison, namely positive or negative, such MSB may be used to select the larger of the two results for output from multiplexer 625.

The difference stored in register 652 on clock cycle 3 of an iteration is provided to LUT 201, and inputs to multiplexer 625 as previously described are provided on such clock cycle. In response to receiving such difference, LUT 201 outputs a correction factor, namely an offset. The larger of the results stored in registers 651 and 653 is output from multiplexer 625 to a data input port of register 661 during clock cycle 3. Furthermore, the correction factor looked up in LUT 201 responsive to a difference stored in register 652 is provided to an input port of register 662 during clock cycle 3 of an iteration.

Select stage 630 includes multiplexer 625, LUT 201, registers 661 and 662, multiplexer 631, and registers 671 and 672. Registers 661 and 662 form a third register stage, namely register stage 413, of ACOS 600. Output of register 661 during clock cycle 3 of an iteration is provided an input port of multiplexer 631. Another input of multiplexer 631 is coupled to receive initial conditions 692. Control select signal 673 is used to select between initial operation of ACOS 600 and subsequent operation for continued processing. As previously described, after initial conditions 692 are processed, control select signal 673 selects input from register 661 for output as state metric 670. Furthermore, output of multiplexer 631 is coupled to an input port of register 671 to provide feedback state metric 601 to routing network 690.

During clock cycle 3 of an iteration, the offset value stored in register 662 is provided to a data input port of register 672. Registers 671 and 672 form a fourth register stage, namely register stage 414. Again, assuming register 672 is not being set or reset as part of initializing ACOS 600 for operation, but rather is for continued operation, then during such fourth clock cycle of an iteration, the log correction term or offset value from register 662 is stored in register 672 for subsequent feedback as offset value 602 to routing network 690.

In a full Turbo decoder, state metric $S_x$ 670 is output or fed forward to a next stage of a log-Map algorithm, not shown for purposes of clarity. Again, because state metrics may be output which are uncorrected, ACOS 600 is to be understood to be an approximation of a full ACSO. However, as described below in additional detail, such approximation may be close to that of a conventional full ACSO.

Each feedback output, namely offset value 602 and state metric 601, is output from routing network 690 for balancing. It should be understood that state metrics 605 and 606, or offset values 607 and 608, are not the same "value." Generally, state metric 601 from ACOS 600 provides either state metric 605 or 606. Output of another state metric 601 or 670 from another ACS/ACSO/ACOS provides the other of state metrics 605 and 606. Likewise, offset value 602 from ACOS 600 provides either offset value 607 or 608, and the other of offset values 607 and 608 is provided from an offset value 602 of another ACS/ACSO/ACOS. Whichever ACS/ACSO/ACOS provides the state metric value, that unit also provides the offset value. In other words, $S_x$ and $O_x$ would be used to provide either $S_a/O_a$ or $S_b/O_b$. The exact routing and the number of ACS/ACSO/ACOS units depends on the specific algorithm being employed. The actual mapping of state metrics and offset values is dependent upon the trellis structure of the convolutional code that routing network 690 implements for coding.

Returning to the example of a 12-bit datapath for state metric 601 and a 3-bit datapath for offset value 602, it should be appreciated that there would be 8 states corresponding to the 3 bits, namely the 3 bits for offset values 602. With 3 bits, each offset can have 8 values or states. "State" here refers to the value of the 3 bits and is not to be confused with the "state" in "state metric".

As each ACOS 600 is pipelined with 4 stages, each ACOS 600 can implement 4 different operations per cycle. With 8 ACSO units 600, therefore, 32 different threads can be implemented per cycle Thus, for example, 32 blocks of data may be processed in 4 clock cycles using 8 ACOSs 600 in parallel. Furthermore, it should be appreciated that for 8 state metric outputs 670, there may be 16 state metric inputs. However, each soft metric in this example might have 8 state metrics and 2 to 4 branch metrics for each soft bit. In this embodiment, it should be further understood that because ACOS 600 has a four register depth, multiple threads, such as four threads in this example, may be processed concurrently within ACOS 600, where each thread would occupy a different register stage. In other words, such processing may be interleaved on the input side of ACOS 600 and then subsequently de-interleaved on the output side of ACOS 600.

Accordingly, it should be appreciated that the approximation of a log-MAP algorithm, namely a max-star log-MAP algorithm, has been described by feeding back offset values or correction terms in the logarithmic domain. Additionally, the state and branch metrics, because it is a log-MAP algorithm, are in the logarithmic domain. It should be further appreciated that multiple iterations may be performed where each iteration is four clock cycles in duration. In this embodiment, by having a latency of four clock cycles, ACOS 600 may be used in applications previously associated with a full conventional ACSO, but with much simpler control and scheduling circuitry due to it having a four-, in contrast to a five-, cycle latency.

State metrics output, such as output 670, is an example of determining likelihood of bit position for bits being decoded. This may be more generally thought of as a log-likelihood ratio for each bit position.

Again, while the description has been in terms of decoding a convolutional code such as by use of a turbo decoder, it should be appreciated that other applications of ACOS 600 are possible. Furthermore, pipelined operation for multithreaded processing may be implemented in dedicated hardware or using field programmable logic gates of a programmable logic device, such as an FPGA, or a combination thereof.

Figure 7:
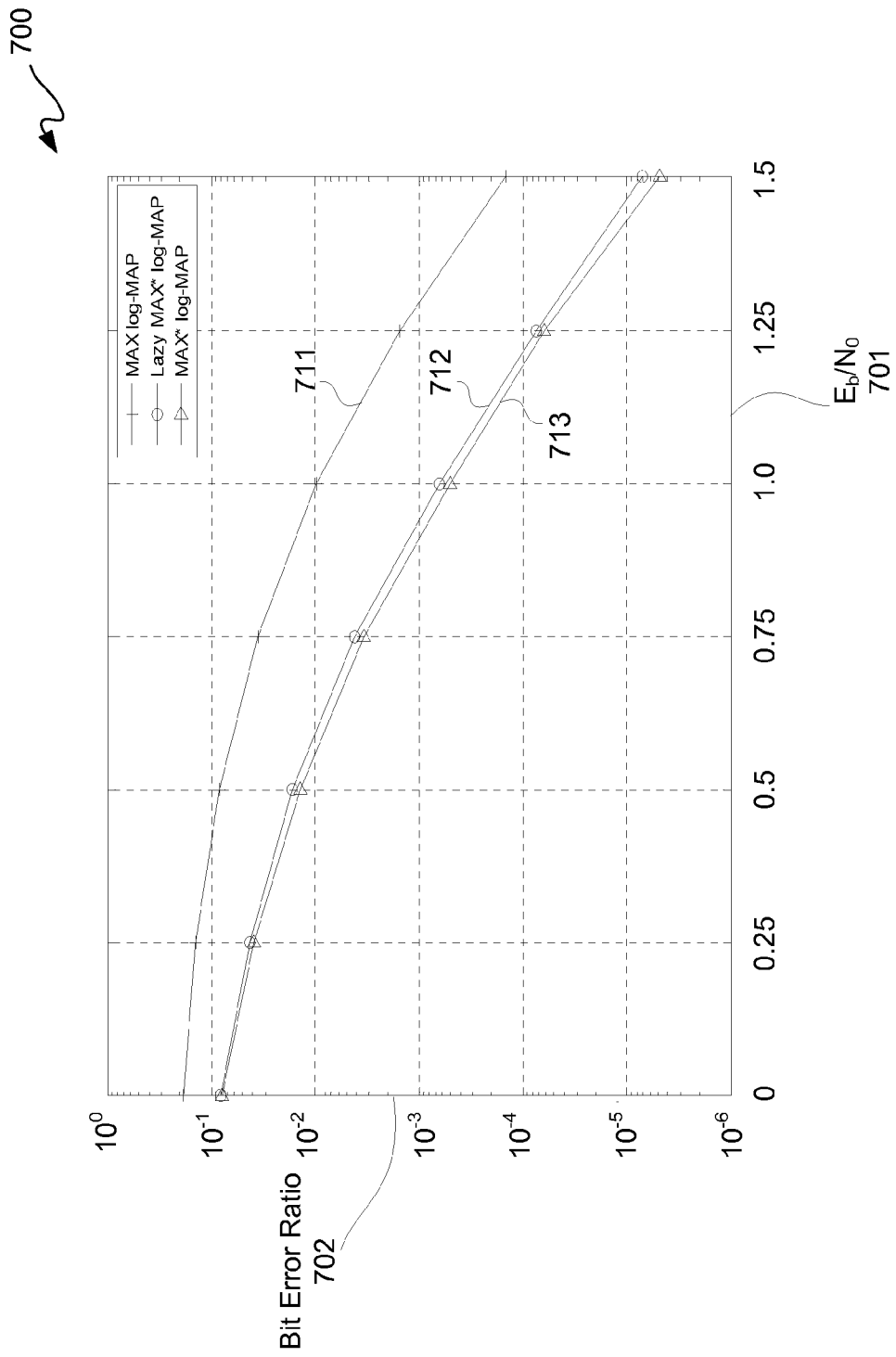
FIG. 7 is a graph diagram depicting an exemplary embodiment of simulation results, including a simulation result for the ACOS of FIG. 6.

FIG. 7 is a graph diagram depicting an exemplary embodiment of simulation results 700, including a simulation result for ACOS 600 of FIG. 6. Axis 701 indicates an energy per bit to noise spectral density ratio ("$E_b/N_o$"), and axis 702 is a log scale of bit error ratio ("BER"). Curve 711 is a simulated BER for a max log-MAP algorithm. Curve 713 is a simulated BER for a max-star log-MAP algorithm. Curve 712 is a simulated BER for a lazy max-star log-MAP algorithm as approximated by ACOS 600 of FIG. 6. Each of curves 712 and 713 was generated from a C++ model incorporating the three algorithms. Furthermore, each of curves 711 through 713 were generated with a block size of 512 and 8 iterations. It should be appreciated that despite being an approximation of a max-star log-MAP algorithm, ACOS 600 has an error-correcting performance comparable to a conventional ACSO as indicated by curve 712 generally corresponding to curve 713.

FIG. 8 is a pseudocode listing depicting an exemplary embodiment of a listing 800 for an ACOS such as ACOS 600 of FIG. 6. Listing 800 is further described with simultaneous reference to FIGS. 6 and 8.

At 801, first state, offset, and branch metrics are initialized, and at 802 second state, offset, and branch metrics are initialized. At 803, state and offset metric results are initialized.

At 804, add stage operations are performed, as previously described with reference to add stage 610. At 805, compare and offset stage operations are preformed, as previously described with reference to compare and offset stage 620. It should be understood that comparison occurs before correction offsets are applied as remarked in listing 800.

At 806, select stage operations are performed, as previously described with reference to select stage 630. It should be understood that a corrected state metric is selected based on an uncorrected difference and a correction term is obtained for a next iteration, as remarked in listing 800. Accordingly, it should be appreciated that ACOS 600 may be a direct replacement for a pipelined ACS unit while having the same latency but offering increased error correction performance.

Figure 9:
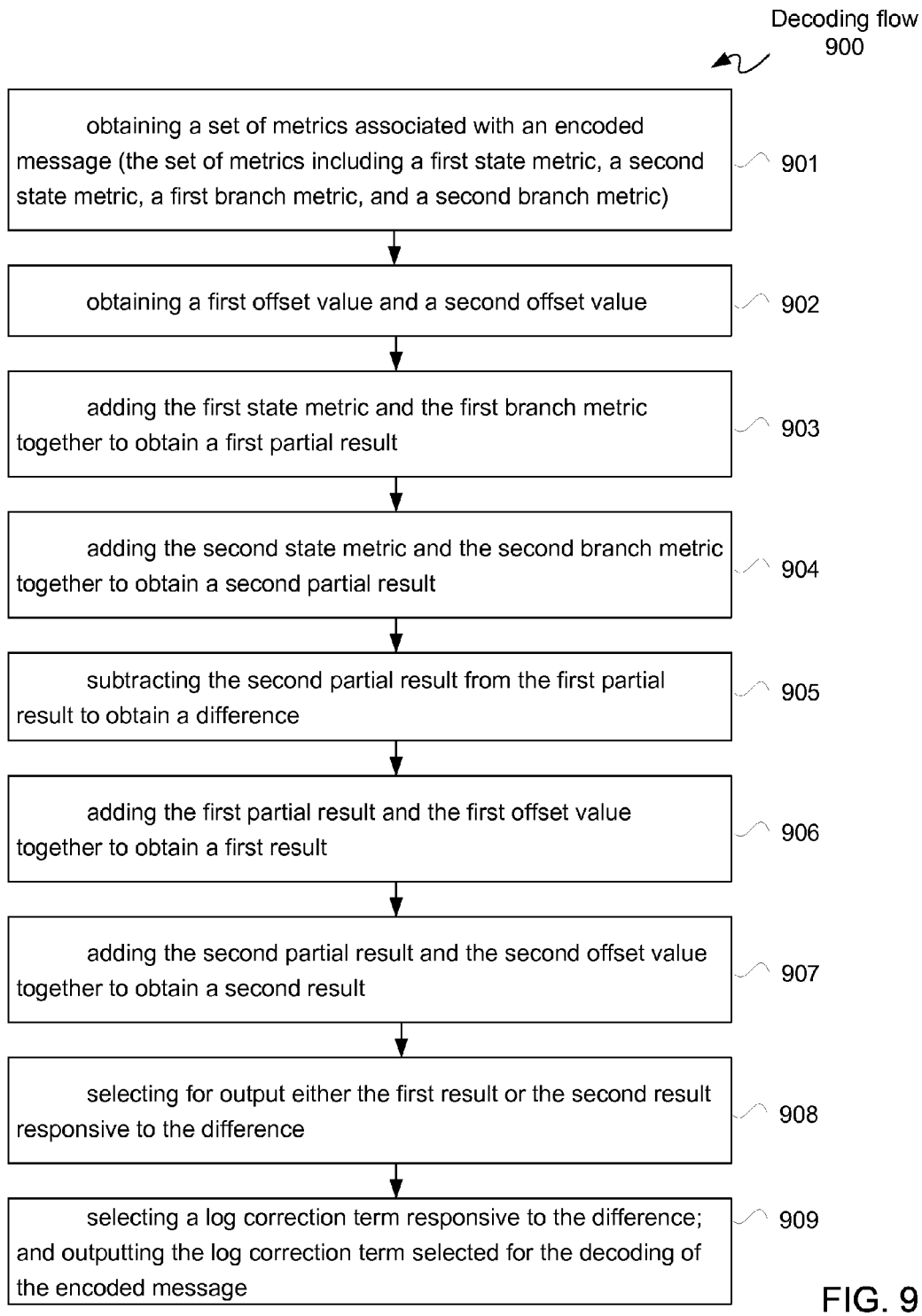
FIG. 9 is a flow diagram depicting an exemplary embodiment of a decoding flow for decoding.

FIG. 9 is a flow diagram depicting an exemplary embodiment of a decoding flow 900 for decoding an encoded message. At 901, a set of metrics associated with the encoded message is obtained that includes a first state metric, a second state metric, a first branch metric, and a second branch metric. At 902, a first offset value and a second offset value are obtained. At 903, the first state metric and the first branch metric are added together to obtain a first partial result. At 904, the second state metric and the second branch metric are added together to obtain a second partial result. At 905, the second partial result is subtracted from the first partial result to obtain a difference. At 906, the first partial result and the first offset value are added together to obtain a first result. At 907, the second partial result and the second offset value are added together to obtain a second result. At 908, either the first result or the second result is selected for output responsive to the difference. At 909, a log correction term is selected responsive to the difference, and the log correction term selected is output for the decoding of the encoded message. The selection of the log correction term can be responsive to a sign of the difference. The decoding flow 900 may use a maximum-star ("max-star") log-MAP algorithm for the decoding.

Figure 10:
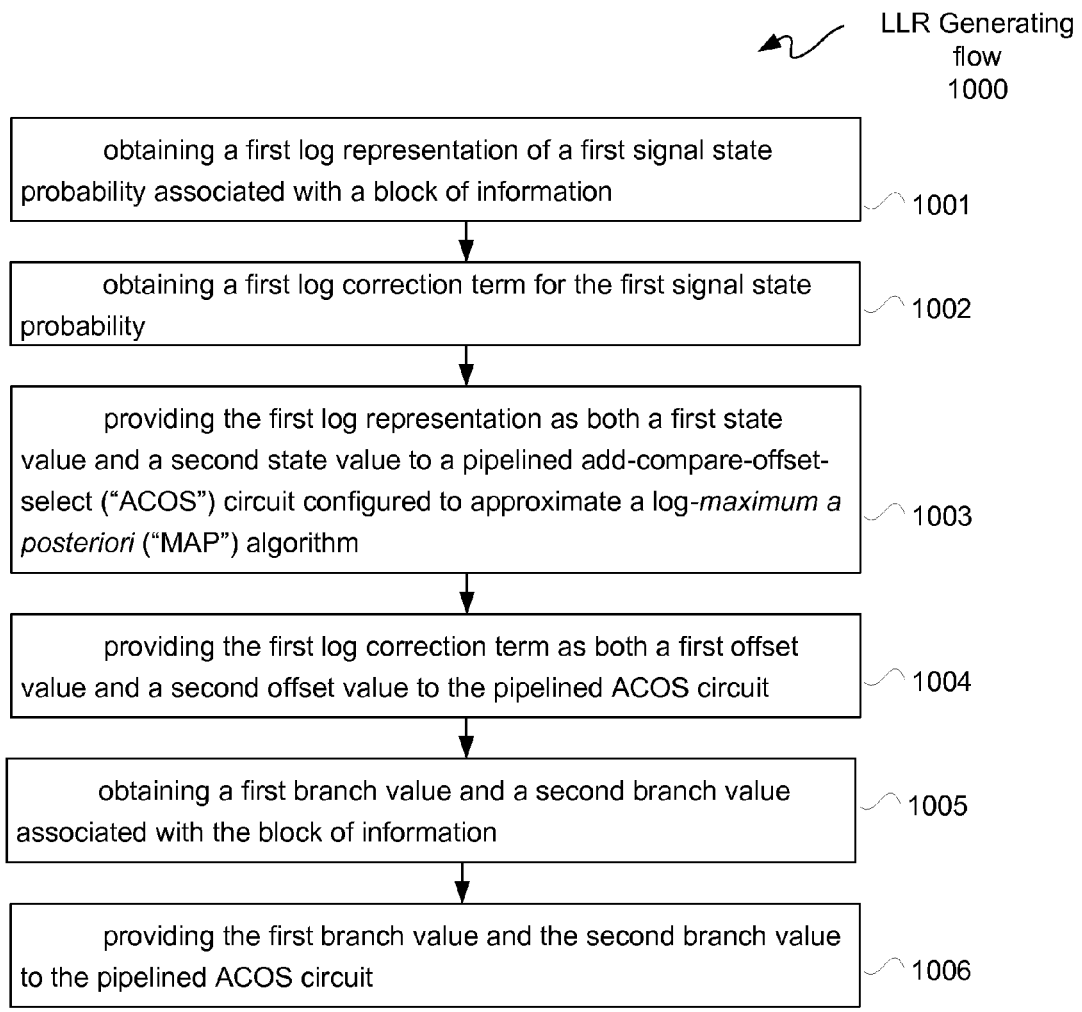
FIG. 10 is a flow diagram depicting an exemplary embodiment of a log-likelihood ratio ("LLR") generating flow for signal processing.

FIG. 10 is a flow diagram depicting an exemplary embodiment of a log-likelihood ratio ("LLR") generating flow 1000 for signal processing. At 1001, a first log representation of a first signal state probability associated with a block of information is obtained. At 1002, a first log correction term for the first signal state probability is obtained. At 1003, the first log representation is provided as both a first state value and a second state value to a ACOS circuit configured to approximate a MAP algorithm. At 1004, the first log correction term is provided as both a first offset value and a second offset value to the pipelined ACOS circuit. At 1005, a first branch value and a second branch value associated with the block of information are obtained. At 1006, the first branch value and the second branch value are provided to the pipelined ACOS circuit. The pipelined ACOS circuit is configured for: adding the first state value and the first branch value together to obtain a first partial result; adding the second state value and the second branch value together to obtain a second partial result; subtracting the second partial result from the first partial result to obtain a difference; adding the first partial result and the first offset value together to obtain a first result; adding the second partial result and the second offset value together to obtain a second result; and selecting for output either the first result or the second result responsive to the difference.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for decoding an encoded message, comprising:
   obtaining a set of metrics associated with the encoded message, wherein the set of metrics includes a first state metric, a second state metric, a first branch metric, and a second branch metric;
   obtaining a first offset value and a second offset value for the iteration associated with the log-MAP algorithm;
   adding the first state metric and the first branch metric together to obtain a first partial result;
   adding the second state metric and the second branch metric together to obtain a second partial result;
   subtracting the second partial result from the first partial result to obtain a difference;
   adding the first partial result and the first offset value together to obtain a first result;
   adding the second partial result and the second offset value together to obtain a second result;
   selecting for output either the first result or the second result responsive to the difference;
   selecting a log correction term responsive to the difference; and
   outputting the selected log correction term, wherein the selected log correction term is used to decode the encoded message.

2. The method according to claim 1, wherein the decoding uses a maximum-star ("max-star") log-MAP algorithm.

3. The method according to claim 1, wherein the selected log correction term is responsive to a sign of the difference.

4. The method according to claim 3, further comprising:
   using the log correction term for obtaining another one of each of the first offset value and the second offset value for another iteration of the decoding; and
   using the output selected for obtaining another set of metrics for the other iteration.

5. A method for generating a log-likelihood ratio for signal processing, comprising:
   obtaining a first log representation of a first signal state probability associated with a block of information;
   obtaining a first log correction term for the first signal state probability;
   providing the first log representation as both a first state value and a second state value to a pipelined add-compare-offset-select ("ACOS") circuit configured to approximate a log-maximum a posteriori ("MAP") algorithm;
   providing the first log correction term as both a first offset value and a second offset value to the pipelined ACOS circuit;
   obtaining a first branch value and a second branch value associated with the block of information;
   providing the first branch value and the second branch value to the pipelined ACOS circuit; and
   the pipelined ACOS circuit configured for:
      adding the first state value and the first branch value together to obtain a first partial result;
      adding the second state value and the second branch value together to obtain a second partial result;
      subtracting the second partial result from the first partial result to obtain a difference;

adding the first partial result and the first offset value together to obtain a first result;

adding the second partial result and the second offset value together to obtain a second result; and selecting for output either the first result or the second result responsive to the difference.

6. The method according to claim 5, further comprising:

pipeline processing the block of information through the pipelined ACOS with a four clock cycle latency for determining likelihood of bit positions of the block of information; and the pipelined processing including:

feeding back the output selected as a second log representation of a second signal state probability associated with the block of information to provide the second log representation as both the first state value and the second state value to the pipelined ACOS circuit;

selecting a second log correction term responsive to the difference for the second signal state probability; and feeding back the second log correction term as both the first offset value and the second offset value to the pipelined ACOS circuit.

7. The method according to claim 6, further comprising storing a set of log correction terms in a look-up table of the pipelined ACOS circuit for obtaining responsive to differences generated by the pipelined processing.

8. The method according to claim 7, wherein the selecting of the output from the pipelined ACOS circuit is responsive to a sign of the difference.

9. The method according to claim 6, wherein:

the pipelined ACOS circuit is coupled to a routing network having a trellis structure associated with a convolutional code;

the routing network is coupled to receive the output fed back and the second log correction term fed back; and the routing network is configured to provide the first state value and the second state value responsive to the output fed back and is configured to provide the first offset value and the second offset value responsive to the second log correction term fed back.

10. SA circuit, comprising:

an add stage;

a compare and offset stage coupled to the add stage;

a select stage coupled to the compare and offset stage; and the select stage coupled for providing a log-likelihood ratio and a log correction term as feedback inputs;

the circuit being an implementation for approximating a log-maximum a posteriori ("MAP") algorithm.

11. The circuit according to claim 10, wherein:

the circuit is coupled to a routing network;

the routing network is coupled to receive the log-likelihood ratio and the log correction term as feedback inputs;

the routing network is configured to provide a first state metric and a second state metric responsive to the log-likelihood ratio;

the routing network is further configured to provide a first offset value and a second offset value responsive to the log correction term;

the add stage is coupled to receive the first state metric, the second state metric, the first offset value, and the second offset value; and the add stage is further coupled to receive a first branch metric and a second branch metric.

12. The circuit according to claim 11, wherein the add stage is configured to:

add the first state metric and the first branch metric together to obtain a first partial result;

add the second state metric and the second branch metric together to obtain a second partial result; and register the first partial result, the second partial result, the first offset value, and the second offset value in a first register stage.

13. The circuit according to claim 12, wherein the compare and offset stage is configured to:

subtract the second partial result from the first partial result to obtain a difference;

add the first partial result and the first offset value together to obtain a first result;

add the second partial result and the second offset value together to obtain a second result; and register the first result, the second result, and the difference in a second register stage.

14. The circuit according to claim 13, wherein the select stage is configured to:

select for output either the first result or the second result responsive to the difference;

select the log correction term from a table of log correction terms responsive to the difference;

register the output selected and the log correction term in a third register stage; and register the output selected and the log correction term in a fourth register stage for providing of the log-likelihood ratio and the log correction term as the feedback inputs.

15. The circuit according to claim 14, wherein the routing network is a trellis structure associated with a convolutional code.

16. The circuit according to claim 15, wherein the routing network is configured to provide the output selected for feedback as both the first state metric and the second state metric for another iteration of the approximation of the log-MAP algorithm.

17. The circuit according to claim 15, wherein the routing network is configured to provide the log correction term for feedback as both the first offset value and the second offset value for another iteration of the approximation of the log-MAP algorithm.

18. The circuit according to claim 14, wherein the select stage includes a multiplexer for selecting between the first result and the second result; and wherein a control input to the multiplexer for the selecting is a Most Significant Bit of the difference.

19. The circuit according to claim 14, wherein the circuit has a four clock cycle latency for a complete iteration of the approximation of the log-MAP algorithm.

20. The circuit according to claim 14, wherein the circuit is implemented in a Field Programmable Gate Array as a pipelined circuit configured for multi-threaded operation.

* * * * *